(12) United States Patent
Shindome et al.

(10) Patent No.: US 10,243,049 B2
(45) Date of Patent: Mar. 26, 2019

(54) NITRIDE SEMICONDUCTOR DEVICE

(71) Applicant: Kabushiki Kaisha Toshiba, Minato-ku (JP)

(72) Inventors: Aya Shindome, Yokohama (JP); Hisashi Saito, Kawasaki (JP); Tatsuo Shimizu, Shinagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/695,659

(22) Filed: Sep. 5, 2017

(65) Prior Publication Data

US 2018/0269290 A1    Sep. 20, 2018

(30) Foreign Application Priority Data

Mar. 17, 2017   (JP) .................................. 2017-053467

(51) Int. Cl.

| H01L 29/20 | (2006.01) |
| H01L 29/78 | (2006.01) |
| H01L 29/66 | (2006.01) |
| H01L 29/778 | (2006.01) |
| H01L 29/423 | (2006.01) |

(52) U.S. Cl.
CPC ...... *H01L 29/2003* (2013.01); *H01L 29/4236* (2013.01); *H01L 29/66462* (2013.01); *H01L 29/66484* (2013.01); *H01L 29/66522* (2013.01); *H01L 29/7783* (2013.01); *H01L 29/7831* (2013.01)

(58) Field of Classification Search
CPC ............. H01L 29/2003; H01L 29/4236; H01L 29/66462; H01L 29/66484; H01L 29/66522; H01L 29/7783; H01L 29/7831
See application file for complete search history.

(56) References Cited

U.S. PATENT DOCUMENTS 7,449,733 B2    11/2008  Inaba et al.
7,915,643 B2 *   3/2011  Suh ..................... H01L 29/1066
                                                      257/192

(Continued)

FOREIGN PATENT DOCUMENTS

| JP | 7-335893 | 12/1995 |
| JP | 4256381 | 4/2009 |

(Continued)

*Primary Examiner* — Ali Naraghi
*Assistant Examiner* — Stephen C Smith
(74) *Attorney, Agent, or Firm* — Oblon, McClelland, Maier & Neustadt, L.L.P.

(57) ABSTRACT

A nitride semiconductor device includes a first semiconductor layer including a nitride semiconductor, a second semiconductor layer contacting the first semiconductor layer and including a nitride semiconductor, a source electrode, a drain electrode, a first gate electrode, a second gate electrode provided on an opposite side, a first insulating layer and a second insulating layer. The gate electrode has a protrusion portion inside the semiconductor layer. A distance between the first gate electrode and the protrusion portion of the second gate electrode is shorter than a distance between the source electrode and the second insulating layer, and shorter than a distance between the drain electrode and the second insulating layer.

5 Claims, 3 Drawing Sheets

(56) References Cited

U.S. PATENT DOCUMENTS

| | | | |
|---|---|---|---|
| 8,344,424 B2* | 1/2013 | Suh | H01L 29/1066 |
| | | | 257/192 |
| 8,907,378 B2 | 12/2014 | Teo et al. | |
| 9,123,799 B2* | 9/2015 | Aktas | H01L 29/7802 |
| 2009/0072272 A1* | 3/2009 | Suh | H01L 29/1066 |
| | | | 257/194 |
| 2010/0065923 A1* | 3/2010 | Charles | H01L 29/2003 |
| | | | 257/402 |
| 2010/0224908 A1 | 9/2010 | Nakazawa et al. | |
| 2013/0062671 A1* | 3/2013 | Saito | H01L 29/7783 |
| | | | 257/288 |
| 2017/0229565 A1* | 8/2017 | Jun | H01L 29/7781 |

FOREIGN PATENT DOCUMENTS

| | | |
|---|---|---|
| JP | 2010-109086 | 5/2010 |
| JP | 2010-206020 | 9/2010 |
| JP | 2014-183311 | 9/2014 |

\* cited by examiner

NITRIDE SEMICONDUCTOR DEVICE

CROSS-REFERENCE TO RELATED APPLICATION

This application is based upon and claims the benefit of priority from the prior Japanese Patent Application No. 2017-053467, filed on Mar. 17, 2017, the entire content of which is incorporated herein by reference.

FIELD

Embodiments of the invention relates to a nitride semiconductor device.

BACKGROUND

A power semiconductor device is used for a switching circuit and an inverter circuit for power control.

The power semiconductor device is required to have a high breakdown voltage and a low on-resistance, and a breakdown voltage and an on-resistance of a power semiconductor device using silicon (Si) are reaching limits based on a physical characteristic of Si.

On the other hand, since a band gap of a nitride semiconductor is wider than that of Si, a semiconductor device using the nitride semiconductor may realize a characteristic having both a lower on-resistance and a higher breakdown voltage when compared with the semiconductor device using silicon.

Due to miniaturization of a field effect transistor (FET) using a nitride semiconductor, a length of a gate of the FET is shortened, and thus a current easily flows between a source and a drain. This phenomenon is referred to as a short channel effect. Improvement in controllability of a threshold voltage of the FET is desired to suppress this short channel effect.

DETAILED DESCRIPTION

Figure 1:
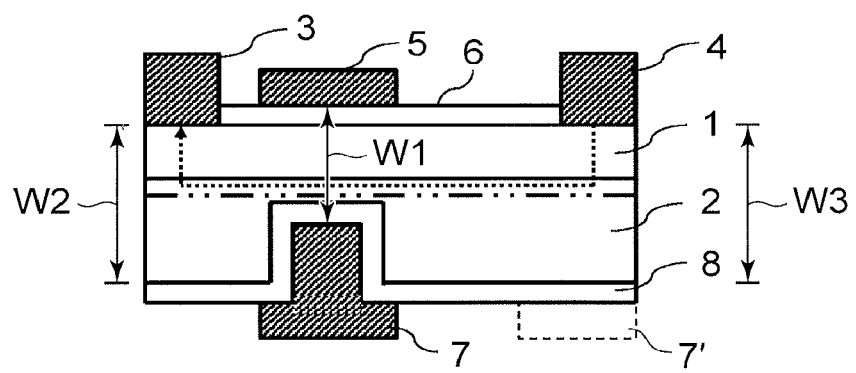
FIG. 1 is a schematic cross-sectional view of a nitride semiconductor device in a first embodiment.

Hereinafter, embodiments of the invention will be described with reference to drawings.

Components assigned with the same reference numeral indicate the same object. It should be noted that the drawings are schematic and conceptual, and a relation between a thickness and a width of each part, a ratio coefficient of sizes between parts, etc. may not be the same as those of actual ones. In addition, even in the case of representing the same part, dimensions or ratio coefficients may be different from each other depending on the drawing.

In this specification, a "GaN-based semiconductor" is a generic name of gallium nitride (GaN), aluminum nitride (AlN), indium nitride (InN) and a semiconductor having intermediate compositions thereof.

First Embodiment

FIG. 1 illustrates a schematic cross-sectional view of a nitride semiconductor device 100.

The nitride semiconductor device 100 is a field effect transistor (FET) including the GaN-based semiconductor.

The nitride semiconductor device 100 includes a first semiconductor layer 1, a second semiconductor layer 2, a source electrode 3, a drain electrode 4, a first gate electrode 5, a first insulating layer 6, a second gate electrode 7, and a second insulating layer 8.

In this instance, when a negative voltage is applied to the second gate electrode 7 that is a back gate, a band structure of a heterointerface of AlGaN/GaN is raised. In this way, it is possible to make the nitride semiconductor device 100, which is normally ON, to normally OFF. That is, it is possible to control a threshold voltage by applying the negative voltage to the second gate electrode 7. When the band structure is lowered by applying a positive voltage to the first electrode 5 corresponding to a top gate after the negative voltages is applied to the second gate electrode 7, the nitride semiconductor device 100 operates to allow a carrier to flow through a channel.

The first semiconductor layer 1 is, for example, aluminum gallium nitride ($Al_xGa_{(1-x)}N$, $0<x\leq1$). Hereinafter, aluminum gallium nitride will be denoted by AlGaN. A thickness of the first semiconductor layer 1 is, for example, 10 nm or more and 100 nm or less. Aluminum nitride (AlN) may be used as the first semiconductor layer 1 in some cases.

The second semiconductor layer 2 is in contact with the first semiconductor layer 1. The second semiconductor layer 2 is, for example, gallium nitride (GaN). A thickness of the second semiconductor layer 2 is, for example, 100 nm or more and 10 µm or less.

The first semiconductor layer 1 is a material having a larger band gap than that of the second semiconductor layer 2.

The source electrode 3 and the drain electrode 4 are provided on the first semiconductor layer 1 on an opposite side to a side of the first semiconductor layer 1 at which the first semiconductor layer 1 is in contact with the second semiconductor layer 2. The source electrode 3 and the drain electrode 4 are, for example, metal electrodes. The metal electrode is, for example, a stacked structure of titanium (Ti) and aluminum (Al).

The first gate electrode 5 is provided between the source electrode 3 and the drain electrode 4 and on the opposite side to the side of the first semiconductor layer 1 at which the first semiconductor layer 1 is in contact with the second semiconductor layer 2. The first gate electrode 5 is, for example, a metal electrode. The first gate electrode 5 is, for example, titanium nitride (TiN).

The first insulating layer 6 is provided between the first semiconductor layer 1 and the first gate electrode 5. The first insulating layer 6 is, for example, silicon oxide, silicon nitride, silicon oxynitride, gallium oxide, aluminum oxide, aluminum oxynitride, hafnium oxide, etc.

The second gate electrode 7 is provided on an opposite side of the second semiconductor layer 2 from a side at which the first semiconductor layer 1 is provided. The second gate electrode 7 faces the first gate electrode 5. The second gate electrode 7 is located at a position overlapping with the first gate electrode 5 when projected in a Z axis direction of FIG. 1. The Z axis direction is a direction from the second semiconductor layer 2 to the first semiconductor layer 1.

The second gate electrode 7 has a protrusion portion. The protrusion portion of the second gate electrode 7 is located inside the second semiconductor layer 2. The second gate electrode 7 is, for example, a metal electrode. The second gate electrode 7 is, for example, titanium nitride (TiN).

The second gate electrode 7 faces the first gate electrode 5. The second gate electrode 7 is located at a position overlapping with the first gate electrode 5 when viewed from the Z axis direction of FIG. 1, and the protrusion of the second gate electrode 7 has a smaller width than that of the first gate electrode 5. In a case in which the second gate electrode 7 does not overlap the first gate electrode 5, there is a possibility that a two-dimensional electron gas (2DEG) inside the second semiconductor layer 2 described below will be depleted when a voltage is applied to the second gate electrode 7.

A distance between the first gate electrode 5 and the second gate electrode 7 is 10 nm or more and 500 nm or less.

Between the first gate electrode 5 and the second gate electrode 7, the thickness of the first semiconductor layer 1 is greater than 0 nm and less than or equal to 50 nm, and the thickness of the second semiconductor layer 2 is greater than 0 nm and less than or equal to 300 nm.

The second insulating layer 8 is provided between the second semiconductor layer 2 and the second gate electrode 7. The second insulating layer 8 covers a surface of the second semiconductor layer 2 at which the second gate electrode 7 is located. The second insulating layer 8 may cover the surface of the second semiconductor layer 2 other than a position at which the second gate electrode 7 is present. The second insulating layer 8 is, for example, silicon oxide, silicon nitride, silicon oxynitride, gallium oxide, aluminum oxide, aluminum oxynitride, hafnium oxide, etc.

A substrate (not illustrated) may be provided under the second gate electrode 7 and the second insulating layer 8, or between the second gate electrode 7 and the second insulating layer 8. In this way, the nitride semiconductor device 100 is fixed. The substrate may be a GaN substrate or a material different from GaN such as silicon (Si), silicon carbide (SiC), sapphire ($Al_2O_3$), etc. In the case of a substrate made of a material different from GaN, a nucleation layer or a buffer layer may be provided between the substrate and the second semiconductor layer 2.

The 2DEG (two-dimensional electron gas) is formed in the second semiconductor layer 2 near the interface between the first semiconductor layer 1 and the second semiconductor layer 2. A long two-dot chain line of FIG. 1 indicates a position at which the 2DEG is present.

Since the protrusion portion of the second gate electrode 7 is located inside the second semiconductor layer 2, a distance between the first gate electrode 5 and the second gate electrode 7 in the Z axis direction of FIG. 1 is short. The first gate electrode 5 and the second gate electrode 7 are able to apply an electric field to the 2DEG at a position close to the 2DEG.

In addition, each of a distance D2 between the source electrode 3 and the second insulating layer 8 and a distance D3 between the drain electrode 4 and the second insulating layer 8 in the Z-axis direction of FIG. 1 is set to be longer than a distance D1 between the first gate electrode 5 and the second gate electrode 7. In this way, it is possible to improve a breakdown voltage among the drain electrode 4, the second gate electrode 7, and a wire 7' connected to the second gate electrode 7 (a gate wire, that is, an extending portion of the gate electrode or a wire electrically connected to the gate electrode). Since a high voltage is applied to the drain electrode 4 and a wire connected to the drain electrode 4, the semiconductor layer needs to be thick at a position at which the drain electrode 4 is present. Furthermore, it is possible to reduce a parasitic capacitance of the wire connected to the second gate electrode 7 by increasing the thickness of the semiconductor layer and increasing a distance between the 2DEG and the wire connected to the second gate electrode 7.

A channel through which current flows is formed in an arrow direction indicated by a dotted line of FIG. 1. When no voltage is applied to the second gate electrode 7, the nitride semiconductor device 100 is normally ON. A negative voltage is applied to the second gate electrode 7 to stop current in the channel and make the nitride semiconductor device 100 normally OFF. That is, when the negative voltage is applied to the second gate electrode 7, the band structure at the interface between the first semiconductor layer 1 and the second semiconductor layer 2 is raised, and the 2D electron gas is depleted. For this reason, it is possible to stop the current in the channel of the second semiconductor layer 2. When the positive voltage to the first electrode 5 after the negative voltage is applied to the second electrode 7, the band structure raised by the negative voltage of the second gate electrode 7 is able to be lowered to allow the electron to flow through the channel and obtain an ON state. Furthermore, a position of the band structure may be adjusted by changing the negative voltage of the second gate electrode 7. Therefore, it is possible to control the threshold voltage of the nitride semiconductor device 100 to an arbitrary value. Further, it is possible to prevent a decrease in the threshold voltage of the short channel effect by applying a voltage to the second gate electrode 7.

A voltage applied to the first gate electrode 5 when the current flows is determined based on a work function of metal constituting the first gate electrode 5, a dielectric constant of the first insulating layer 6, a thickness of the first insulating layer 6, concentration of donors or acceptors contained in the first semiconductor layer 1, and a surface potential of the first semiconductor layer 1.

As described above, in the nitride semiconductor device 100 of the present embodiment, a normally OFF state is able to be obtained by applying a negative voltage to the second gate electrode 7, an ON state is able to be obtained by applying a positive voltage to the first gate electrode 5, and the threshold voltage is able to be controlled to a desired value by changing the negative voltage of the second gate electrode 7.

Besides, the first semiconductor layer 1 is, for example, non-doped. The second semiconductor layer 2 is, for example, non-doped. In the case the second semiconductor layer 2 is non-doped GaN, the second semiconductor layer 2 is a weak n-type semiconductor layer.

Hereinafter, a description will be given of a method of manufacturing the nitride semiconductor device 100.

First, the second semiconductor layer 2 and the first semiconductor layer 1 are formed on a first semiconductor wafer, for example, a silicon substrate through a buffer layer, for example, by a metal organic chemical vapor deposition (MOCVD) method. The buffer layer is formed in a multilayer structure of, for example, aluminum gallium nitride ($Al_xGa_{1-x}N$ ($0<x\leq1$)).

Subsequently, the first insulating layer 6 is formed on the first semiconductor layer 1. The first insulating layer 6 is, for example, silicon nitride, silicon oxide, or a stacked film thereof. The first insulating layer 6 is formed by, for example, a plasma CVD method. The thickness of the first insulating layer 6 is, for example, 0.5 nm or more and 500 nm or less. After forming the first insulating layer 6, a process such as ion implantation for element isolation, mark formation, etc. may be included.

Subsequently, a metal film used for the gate electrode is deposited on the first insulating layer 6. The metal film is formed by sputtering. The metal film is, for example, titanium nitride. Subsequently, titanium nitride is patterned using a photoresist as a mask to form the first gate electrode 5.

Subsequently, a portion of the first insulating layer 6 in which the source electrode and the drain electrode are to be formed is removed using a photoresist as a mask. Subsequently, a surface of the first semiconductor layer 1 may be etched by several nm by dry etching.

Subsequently, a photoresist film is formed, and source and drain electrode portions are patterned. Subsequently, a metal film for source and drain electrodes is formed by sputtering or evaporation. Then, the source electrode 3 and the drain electrode 4 are formed using a lift-off method.

Subsequently, an insulating film A (not illustrated) is formed to cover the first insulating layer 6, the first gate electrode 5, the source electrode 3, and the drain electrode 4. The insulating film A is, for example, silicon oxide. Subsequently, a contact portion and a wire to the first gate electrode 5, the source electrode 3, and the drain electrode 4 may be formed in the insulating film A and on an upper surface of the insulating film A.

Here, a second semiconductor wafer is prepared. An insulating film B is deposited on the second semiconductor wafer. The insulating film B is, for example, silicon oxide. The second semiconductor wafer is, for example, a silicon wafer or a glass substrate. Further, a surface of the second semiconductor wafer on which the insulating film B is present is bonded to a surface of the insulating film A on an opposite side to a side at which the gate electrode 5, etc. is present (the upper surface of the insulating film A). When the second semiconductor layer 2 is processed from a side where the first semiconductor wafer or buffer is present, the second semiconductor wafer serves as a support substrate.

Subsequently, the first semiconductor wafer and the buffer layer used for manufacturing the nitride semiconductor are removed by, for example, dry etching.

Subsequently, a depression (trench) is formed by performing dry etching on the second semiconductor layer 2 to locate the protrusion portion of the second gate electrode 7 inside the second semiconductor layer 2. Thereafter, wet etching is used to remove a surface of the second semiconductor layer 2, which is a nitrogen surface. Wet etching is easily performed on a semiconductor layer whose surface is a nitrogen surface when compared to a semiconductor layer whose surface is a gallium surface.

Subsequently, a second gate insulating film 8 is formed on the surface and the depression of the second semiconductor layer 2 by, for example, a plasma CVD method. The second gate insulating film 8 is, for example, silicon nitride, silicon oxide, or a laminated film thereof.

Subsequently, the second gate electrode 7 is formed. A metal film is deposited on the second gate insulating film 8 by sputtering. Thereafter, the metal film is patterned by etching using a photoresist mask.

Thereafter, if desired, it is possible to perform a process of peeling off the second semiconductor wafer serving as the support substrate, and a process of forming the contact portion and the wire reaching the first gate electrode 5, the second gate electrode 7, the source electrode 3, and the drain electrode 4 through the support substrate.

Second Embodiment

Figure 2:
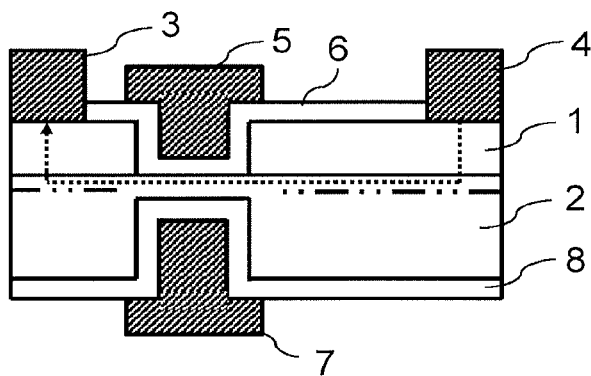
FIG. 2 is a schematic cross-sectional view of a nitride semiconductor device in a second embodiment.

FIG. 2 illustrates a nitride semiconductor device 101.

The same reference numeral will be assigned to the same portion as that of the nitride semiconductor device 100 of FIG. 1, and a description thereof will be omitted.

In the second embodiment, a first gate electrode 5 has a protrusion portion. The protrusion portion of the first gate electrode 5 is located inside a first semiconductor layer 1, and the protrusion portion penetrates the first semiconductor layer 1, and reaches up to a second semiconductor layer 2. Only the second semiconductor layer 2 is present between the protrusion portion of the first gate electrode 5 and a protrusion portion of a second gate electrode 7. For this reason, 2DEG does not exist in the second semiconductor layer 2 between the protrusion portion of the first gate electrode 5 and the protrusion portion of the second gate electrode 7. Therefore, when no voltage is applied to the second gate electrode 7, the nitride semiconductor device 101 is normally OFF. 2DEG is present in the second semiconductor layer 2 near the interface between the first semiconductor layer 1 and the second semiconductor layer 2 except for a region facing the protrusion portion of the first gate electrode 5. A long two-dot chain line of FIG. 2 indicates a position at which 2DEG is present.

Since the second semiconductor layer 2 is non-doped GaN, the second semiconductor layer 2 is a weak n-type semiconductor layer. When a negative voltage is applied to the second gate electrode 7, the second semiconductor layer 2 between the protrusion portion of the first gate electrode 5 and the protrusion portion of the second gate electrode 7 is in a depleted state. For this reason, a band structure of the second semiconductor layer 2 is raised. In a case in which a positive voltage is applied to the first gate electrode 5 after a negative voltage is applied to the second gate electrode 7, the second semiconductor layer 2 on a side of the first gate electrode 5 is in an accumulated state in which electrons accumulate. For this reason, electrons in the second semiconductor layer 2 in the accumulated state are connected to 2DEG present at the interface between the first semiconductor layer 1 and the second semiconductor layer 2. Therefore, current flows in an arrow direction indicated by a dotted line of FIG. 2. Accordingly, the nitride semiconductor device 101 operates as an FET.

That is, when the positive voltage to the first electrode 5 after the negative voltage is applied to the second electrode 7, the band structure raised by the negative voltage of the second gate electrode 7 is possible to be lowered to allow electrons to flow through a channel and obtain an ON state. When the negative voltage of the second gate electrode 7 is changed, a position of the band structure may be adjusted, and a threshold voltage of the nitride semiconductor device 101 may be controlled to a desired value.

FIG. 2 illustrates a case in which only the second semiconductor layer 2 is present between the protrusion portion of the first gate electrode 5 and the protrusion portion of the second gate electrode 7. However, both the first semiconductor layer 1 and the second semiconductor layer 2 may be present between the protrusion portion of the first gate electrode 5 and the protrusion portion of the second gate electrode 7.

Since the protrusion portion of the first gate electrode 5 is buried in the first semiconductor layer 1, a thickness of the first semiconductor layer 1 located between the protrusion portion of the first gate electrode 5 and the protrusion portion of the second gate electrode decreases when compared to the nitride semiconductor device 100 of FIG. 1. In this way, a concentration of 2DEG decreases, and the threshold voltage increases (rises). Therefore, the threshold voltage of the nitride semiconductor device 101 is higher than that of the nitride semiconductor device 100 of FIG. 1. For this reason, when a voltage is applied to the second gate electrode 7, the threshold voltage may be more easily increased than in the case of the nitride semiconductor device 100.

Third Embodiment

Figure 3:
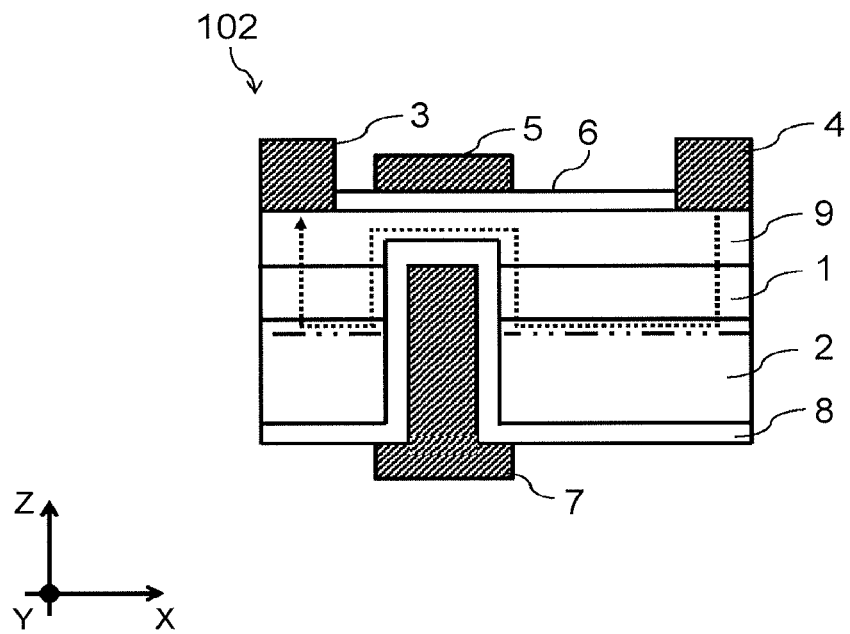
FIG. 3 is a schematic cross-sectional view of a nitride semiconductor device in a third embodiment.

FIG. 3 illustrates a nitride semiconductor device 102.

The same reference numeral will be assigned to the same portion as that of the nitride semiconductor device 100 of FIG. 1, and a description thereof will be omitted.

In a third embodiment, a third semiconductor layer 9 is provided between a first semiconductor layer 1 and each of a first insulating layer 6, a source electrode 3, and a drain electrode 4. The third semiconductor layer 9 is GaN. A thickness of the third semiconductor layer 9 is 1 nm or more and 30 nm or less.

Only the third semiconductor layer 9 is present between a first gate electrode 5 and a second gate electrode 7. For this reason, 2DEG is not present in the third semiconductor layer 9 between the first gate electrode 5 and a protrusion portion of the second gate electrode 7. Therefore, the nitride semiconductor device 102 is normally OFF. The thickness of the third semiconductor layer 9 is 30 nm or less between the first gate electrode 5 and the second gate electrode 7. 2DEG is present in a second semiconductor layer 2 near the interface between the first semiconductor layer 1 and the second semiconductor layer 2. A long two-dot chain line of FIG. 3 indicates a position at which 2DEG is present.

Since the third semiconductor layer 9 is non-doped GaN, the third semiconductor layer 9 is a weak n-type semiconductor layer. When a negative voltage is applied to the first gate electrode 5, the third semiconductor layer 9 between the first gate electrode 5 and the protrusion portion of the second gate electrode 7 is in a depleted state. In a case in which a positive voltage is applied to the second gate electrode 7 after the negative voltage is applied to the first gate electrode 5, a second gate electrode side of the third semiconductor layer 9 is in an accumulated state in which electrons accumulate. For this reason, the electrons of the third semiconductor layer 9 in the accumulated state are connected to 2DEG present at the interface between the first semiconductor layer 1 and the second semiconductor layer 2. Therefore, current flows in an arrow direction indicated by a dotted line of FIG. 3. Therefore, the nitride semiconductor device 102 operates as an FET.

It is possible to flow electrons through a channel to obtain an ON state by applying the positive voltage to the second electrode 7 after applying the negative voltage to the first electrode 5. Further, it is possible to control a threshold voltage of the nitride semiconductor device 102 to a desired value by changing the negative voltage of the first gate electrode 5 to adjust a position of a band structure.

Fourth Embodiment

Figure 4:
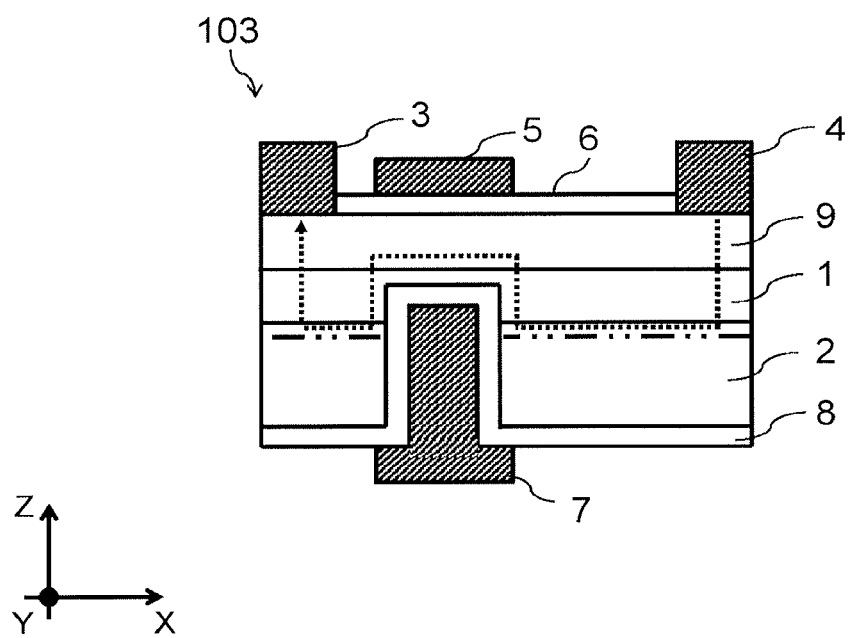
FIG. 4 is a schematic cross-sectional view of a nitride semiconductor device in a fourth embodiment.

FIG. 4 illustrates a nitride semiconductor device 103.

The same reference numeral will be assigned to the same portion as that of the nitride semiconductor device 102 of FIG. 3, and a description thereof will be omitted.

In a fourth embodiment, a first semiconductor layer 1 and a third semiconductor layer 9 are present between a first gate electrode 5 and a second gate electrode 7. 2D electron gas is not present in the third semiconductor layer 9 between the first gate electrode 5 and a protrusion portion of the second gate electrode 7. Therefore, the nitride semiconductor device 103 is normally OFF. 2DEG is present in a second semiconductor layer 2 near the interface between the first semiconductor layer 1 and the second semiconductor layer 2. A long two-dot chain line of FIG. 4 indicates a position at which a 2D electron gas layer is present.

Since the third semiconductor layer 9 is non-doped GaN, the third semiconductor layer 9 is a weak n-type semiconductor layer. As in the case of the nitride semiconductor device 102 of FIG. 3, when a negative voltage is applied to the first gate electrode 5, the third semiconductor layer 9 between the first gate electrode 5 and a protrusion portion of the second gate electrode 7 is in a depleted state. In a case in which a positive voltage is applied to the second gate electrode 7 after a negative voltage is applied to the first gate electrode 5, the third semiconductor layer 9 on a second gate electrode 7 side is in an accumulated state in which electrons accumulate. For this reason, the electrons of the third semiconductor layer 9 in the accumulated state between the first gate electrode 5 and the protrusion portion of the second gate electrode 7 are connected to 2DEG present at the interface between the first semiconductor layer 1 and the second semiconductor layer 2. Therefore, current flows in an arrow direction indicated by a dotted line of FIG. 4. Accordingly, the nitride semiconductor device 103 operates as an FET.

An ON state is possible to be obtained by applying a positive voltage to the second electrode 7 after applying a negative voltage to the first electrode 5. Further, a threshold voltage of the nitride semiconductor device 103 is possible to be controlled to a desired value by changing the negative voltage of the first gate electrode 5 to adjust a position of a band structure. Unlike the case of the nitride semiconductor device 102 of FIG. 3, the protrusion portion of the second gate electrode 7 does not reach the third semiconductor layer 9. For this reason, a manufacturing process for forming the second gate electrode 7 does not affect a channel present in the third semiconductor layer 9.

Fifth Embodiment

Figure 5:
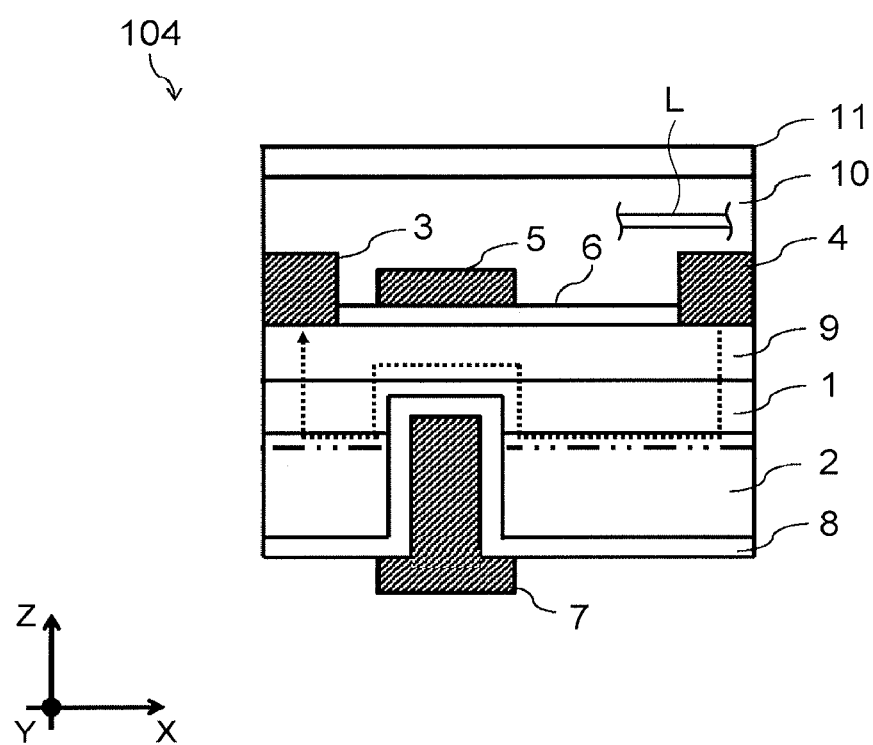
FIG. 5 is a schematic cross-sectional view of a nitride semiconductor device in a fifth embodiment.

FIG. 5 illustrates a nitride semiconductor device 104.

The same reference numeral will be assigned to the same portion as that of the nitride semiconductor device 102 of FIG. 3, and a description thereof will be omitted.

In a fifth embodiment, the nitride semiconductor device 104 further includes a third insulating layer 10 and a substrate 11 in the nitride semiconductor device 103.

The third insulating layer 10 is provided on a source electrode 3, a drain electrode 4, a gate electrode 5, and a first insulating layer 6 on an opposite side from a side at which a third semiconductor layer 9 is present.

The third insulating layer 10 is a low-k material having a dielectric constant of 8.0 or less. The third insulating layer 10 is, for example, silicon oxide, a silicon oxide-based material containing carbon or hydrogen, an organic material made of carbon and hydrogen, etc. When the third insulating layer 10 is included, and a wire (L) connected to each of the source electrode 3, the drain electrode 4, and the gate electrode 5 passes through the third insulating layer 10, it is possible to reduce an electric capacity from the substrate when compared to a case in which a semiconductor layer having a high dielectric constant is interposed.

The substrate 11 is provided on the third insulating layer 10 on an opposite side from a side at which the third semiconductor layer 9 is present. The substrate 11 supports the entire semiconductor layer of the nitride semiconductor device 104 through the third insulating layer 10.

The nitride semiconductor device 104 of FIG. 5 further includes the third insulating layer 10 and the substrate 11 in the nitride semiconductor device 103. However, the same effect as that of the nitride semiconductor device 104 of FIG. 5 may be obtained when the third insulating layer 10 and the substrate 11 are further included in the nitride semiconductor devices 100 to 102.

Several embodiments of the invention have been described. However, these embodiments have been presented as examples and are not intended to limit the scope of the invention. The embodiments may be implemented in various other forms and various omissions, substitutions, and changes may be made without departing from the subject matter of the invention. The embodiments and modifications thereof are included in the scope and the subject matter of the description as well as the invention described in the claims and the equivalent scope thereof.

What is claimed is:

1. A nitride semiconductor device comprising:
   a first semiconductor layer including a nitride semiconductor;
   a second semiconductor layer contacting the first semiconductor layer and including a nitride semiconductor;
   a source electrode and a drain electrode provided on an opposite side of the first semiconductor layer from the second semiconductor layer;
   a first gate electrode provided on an opposite side of the first semiconductor layer from the second semiconductor layer, and the first gate electrode is provided between the source electrode and the drain electrode;
   a first insulating layer provided between the first gate electrode and the first semiconductor layer;
   a second gate electrode provided on an opposite side of the second semiconductor from the first semiconductor layer, the second gate electrode overlapping the first gate electrode in a direction from the second semiconductor layer to the first gate electrode, and the second gate electrode having a protrusion portion, and the protrusion portion being located inside the second semiconductor layer; and
   a second insulating layer provided between the second gate electrode and the second semiconductor layer, wherein;
   a distance between the first gate electrode and the protrusion portion of the second gate electrode is shorter than a distance between the source electrode and the second insulating layer and shorter than a distance between the drain electrode and the second insulating layer,
   the first gate electrode further has a protrusion portion, the protrusion portion of the first gate electrode being located inside the first semiconductor layer, and
   only the second semiconductor layer is provided between the protrusion portion of the first gate electrode and the protrusion portion of the second gate electrode.

2. A nitride semiconductor device comprising:
   a first semiconductor layer including a nitride semiconductor;
   a second semiconductor layer contacting the first semiconductor layer and including a nitride semiconductor;
   a source electrode and a drain electrode provided on an opposite side of the first semiconductor layer from the second semiconductor layer;
   a first gate electrode provided on the opposite side of the first semiconductor layer from the second semiconductor layer and between the source electrode and the drain electrode;
   a first insulating layer provided between the first gate electrode and the first semiconductor layer;
   a third semiconductor layer provided between the first semiconductor layer and each of the first insulating layer, the source electrode, and the drain electrode, and including a nitride semiconductor;
   a second gate electrode provided on an opposite side of the second semiconductor layer from the first semiconductor layer, the second gate electrode overlapping the first gate electrode in a direction from the second semiconductor layer to the first gate electrode, the second gate electrode having a protrusion portion, and the protrusion portion being located inside the first semiconductor layer and inside the second semiconductor layer; and
   a second insulating layer provided between the second gate electrode and the second semiconductor layer,
   wherein the third semiconductor layer is provided between the first gate electrode and the protrusion portion of the second gate electrode, and a distance between the first gate electrode and the protrusion portion of the second gate electrode is shorter than a distance between the source electrode and the second insulating layer and a distance between the drain electrode and the second insulating layer.

3. The nitride semiconductor device according to claim 2, wherein only the third semiconductor layer is provided between the first gate electrode and the protrusion portion of the second gate electrode.

4. The nitride semiconductor device according to claim 3, wherein the first semiconductor layer is provided between the first gate electrode and the protrusion portion of the second gate electrode.

5. The nitride semiconductor device according to claim 4, further comprising:
   a third insulating layer provided on an opposite of the first gate electrode, the source electrode and the drain electrode from the third semiconductor layer; and
   a substrate provided on an opposite side of the third insulating layer from the third semiconductor layer.

* * * * *